United States Patent
Chen et al.

(10) Patent No.: US 6,623,654 B2
(45) Date of Patent: Sep. 23, 2003

(54) THIN INTERFACE LAYER TO IMPROVE COPPER ETCH STOP

(75) Inventors: Bi-Trong Chen, Taiwan (TW); Lain-Jong Li, Hualien (TW); Syun-Ming Jang, Hsin-Chu (TW); Shu E Ku, Miadi (TW); Tien I. Bao, Hsin-Chu (TW); Lih-Ping Li, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 116 days.

(21) Appl. No.: 10/035,578

(22) Filed: Nov. 9, 2001

(65) Prior Publication Data

US 2003/0089678 A1 May 15, 2003

(51) Int. Cl.$^7$ .............................. B44C 1/22; H01L 21/00
(52) U.S. Cl. .......................... 216/33; 216/88; 438/692; 438/740; 438/745
(58) Field of Search .............................. 216/33, 35, 38, 216/67, 78, 88, 91; 134/1.2, 1.3; 438/692, 723, 740, 743, 745, 756; 156/345.12

(56) References Cited

U.S. PATENT DOCUMENTS

| | | | |
|---|---|---|---|
| 5,946,601 A | 8/1999 | Wong et al. | 438/783 |
| 6,100,587 A | 8/2000 | Merchant et al. | 257/751 |
| 6,136,680 A | 10/2000 | Lai et al. | 438/597 |

*Primary Examiner*—William A. Powell
(74) *Attorney, Agent, or Firm*—George O. Saile; Stephen B. Ackerman

(57) ABSTRACT

In accordance with the objectives of the invention a new method is provided for improving adhesion strength that is deposited over the surface of a layer of copper. Conventional etch stop layers of for instance dichlorosilane ($SiCl_2H_2$) or SiOC have poor adhesion with an underlying layer of copper due to poor molecular binding between the interfacing layers. The surface of the deposited layer of copper can be provided with a special enhanced interface layer by using a method provided by the invention. That is pre-heat of the copper layer followed by a pre-cleaning treatment with ammonia ($NH_3$) and $N_2$, followed by forming an adhesive enhanced layer over the copper layer by treatment with $N_2$ or $O_2$ or $N_2$ with alkyl-silane or alkyl silane.

30 Claims, 1 Drawing Sheet

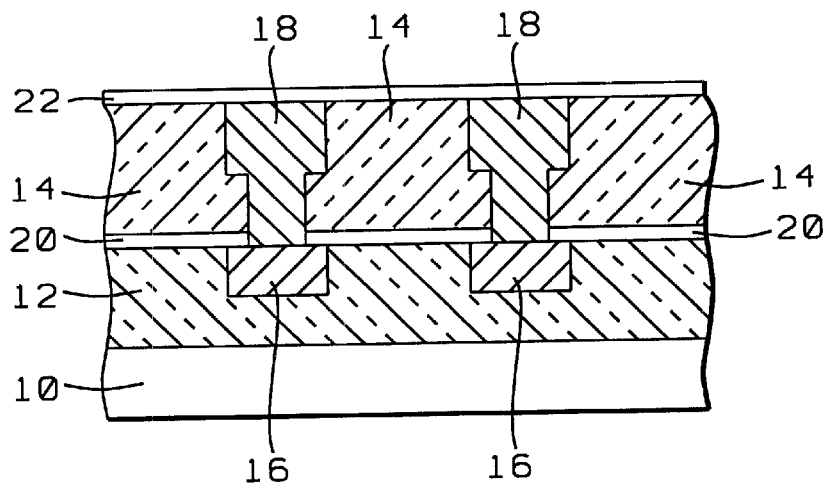
FIG. 1 — Prior Art
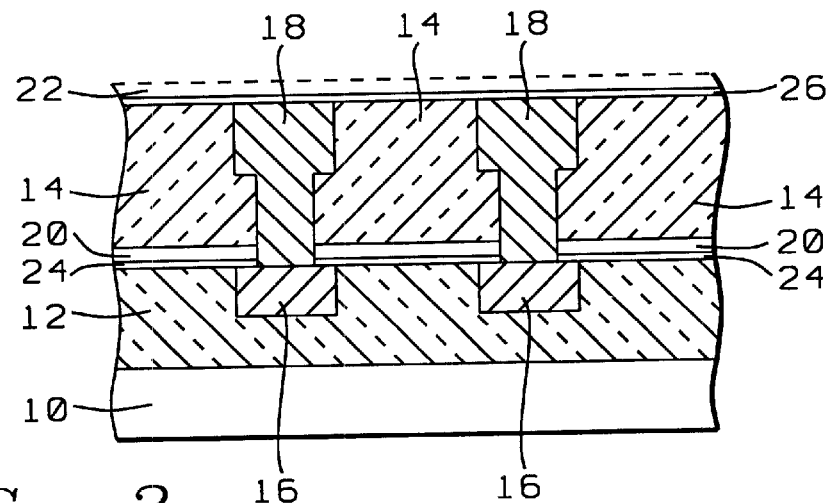
FIG. 2
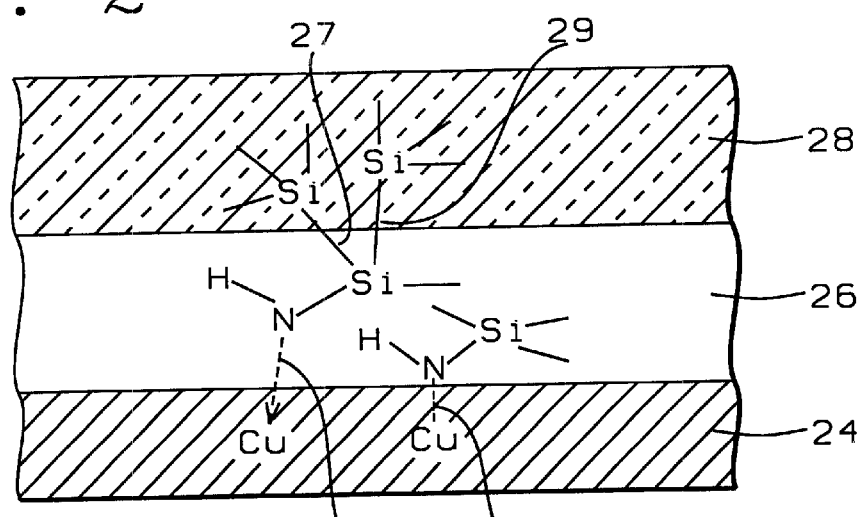
FIG. 3

THIN INTERFACE LAYER TO IMPROVE COPPER ETCH STOP

BACKGROUND OF THE INVENTION (1) Field of the Invention

The invention relates to the fabrication of integrated circuit devices, and more particularly, to a method to improve the etch stop when etching copper surfaces.

(2) Description of the Prior Art

The creation of semiconductor devices requires the deposition and patterning of numerous layers of semiconductor material, which are then patterned and etched to form device features of required dimensions and electrical performance characteristics. After the semiconductor devices essentially have been created, device elements may have to be interconnected in order to create functional entities. As interconnect materials are typically used metallic materials comprising for instance aluminum, tungsten, titanium, copper, polysilicon, polycide or alloys of these metals. Interconnects are formed by first depositing a layer of metallic material and then patterning and etching the layer of metallic material to form the desired interconnect pattern. Layers of wiring material are typically about 1,000 to 10,000 Angstrom thick, more preferably about 4,000 Angstrom. Wiring that serves as interconnect lines is typically about 1,000 and 8,000 Angstrom wide, more preferably about 5,000 Angstrom wide. In addition to forming interconnect traces, contact plugs or vias also form an integral part of an interconnect network. Plugs can be formed using a conducting or metallic substance such as copper, tungsten, wolfram, titanium nitride, molybdenum, silicide and polysilicon, tantalum or a silicide (including, for example, TiSix, WSix, NiSix, MoSix, TaSix, PdSix, CoSix and others).

As part of the creation of metal interconnects, layers that serve purposes other than forming a conductive interface between points are frequently applied for reasons of device performance requirements and reliability. Such layers include for instance the well known application of a layer of seed material, to enhance adhesion between overlying layers of which the upper layer is a conductive layer, or barrier layers, to prevent diffusion of metallic substance into surrounding dielectrics.

A number of methods are widely used for the creation of a layer of conductive material such as methods of sputter, electro or electroless metal deposition and methods of CVD. For instance, EDS bath processing can be applied for the creation of a layer of copper at a temperature between about 25 and 50 degrees, the source of deposition being the dilution of $H_2SO_4$, $CuSO_4$ and HCl with a deposition flow rate of between about 15K and 20 K sccm, a deposition time of between about 1 and 10 minutes, a voltage being applied to the anode of the EDS bath of between about 0.1 and 2 volts and a voltage being applied to the cathode of between about 0.1 and 2 volts. The EDS process is particularly suited for the creation of copper metal plugs, since the copper plug is created in a well-controlled manner due to the fact that EDS Cu deposits copper only on places that have a copper seed layer.

Interconnect contacts or vias are typically created by first depositing a layer of dielectric over a metallic layer, preferable comprising copper, etching openings through the layer of dielectric in the locations where the interconnect contacts or vias are to be located and filling the created openings with a conductive substance, electrically contacting the underlying layer of copper. The etch of the layer of dielectric requires a layer of etch stop material which effectively stops the etch through the layer of dielectric at the surface of the underlying layer of copper. The layer of etch stop material must have good adhesion to the underlying copper surface in order to prevent problems of etch or adhesion of the overlying layer of dielectric resulting in problems of device reliability. The invention provides such a layer by providing an adhesion promotion layer for the adhesion of an etch stop layer that has been deposited over a copper surface. The layer of adhesion promotion material of the invention assures strong adhesion to the underlying copper surface and to the overlying etch stop layer.

U.S. Pat. No. 6,136,680 (Lai et al.) shows a SiC layer on copper 30, see FIG. 6.

U.S. Pat. No. 6,100,587 (Merchant et al.) shows SiC barrier layers in a copper interconnect process.

U.S. Pat. No. 5,946,601 (Wong et al.) reveals a carbon-containing barrier layer.

SUMMARY OF THE INVENTION

A principle objective of the invention is to provide a layer over the surface of copper that serves as an adhesion promotion layer between copper and an etch stop layer.

Another objective of the invention is to eliminate concerns of peeling or delamination between the surface of a layer of copper and an overlying etch stop layer.

In accordance with the objectives of the invention a new method is provided for improving adhesion strength that is deposited over the surface of a layer of copper. Conventional etch stop layers of for instance dichlorosilane ($SiCl_2H_2$) or SiOC have poor adhesion with an underlying layer of copper due to poor molecular binding between the interfacing layers. The surface of the deposited layer of copper can be provided with a special enhanced interface layer by using a method provided by the invention. That is pre-heat of the copper layer followed by a pre-cleaning treatment with ammonia ($NH_3$) and $N_2$, followed by forming an adhesive enhanced layer over the copper layer by treatment with $N_2$ or $O_2$ or $N_2$ with alkyl-silane or alkyl silane.

BRIEF DESCRIPTION OF THE DRAWINGS

FIG. 1 shows a cross section of a prior art method of forming copper plugs overlying a layer of copper.

FIG. 2 shows a cross section of the invention of forming copper plugs overlying a layer of copper.

FIG. 3 provides an explanation of the molecular interaction provided by the invention between a copper surface and an overlying etch stop layer.

DESCRIPTION OF THE PREFERRED EMBODIMENTS

Referring now specifically to a prior art method of forming copper plugs overlying a layer of copper, which is shown in cross section in FIG. 1. The cross section of FIG. 1 shows:

10, a semiconductor surface, typically the surface of a semiconductor silicon substrate 12, a first layer of dielectric deposited over the surface of layer 10

14, a second layer of dielectric deposited over the surface of the first Etch Stop Layer (ESL) 12 of dielectric 16, first copper plugs formed in the first layer 12 of dielectric 18, second copper plugs formed in the second layer 14 of dielectric; copper plugs 18 align with copper plugs 16

20, a first Etch Stop Layer (ESL) created over the surface of the first layer 12 of dielectric, and

22, a second Etch Stop Layer (ESL) created over the surface of the second layer 14 of dielectric.

The methods and procedures that are used to create the interconnect arrangement that is shown in cross section in FIG. 1 are well known in the art. This and the observation that these methods are not germane to the invention obviate a need for further explanation of these methods and procedures at this time.

Referring now specifically to the cross section that is shown in FIG. 2, there is shown:

10, a semiconductor surface, typically the surface of a semiconductor silicon substrate

12, a first layer of dielectric deposited over the surface of layer 10

14, a second layer of dielectric deposited over the surface of the first Etch Stop Layer (ESL) 24

16, first copper plugs formed in the first layer 12 of dielectric

20, a first Etch Stop Layer (ESL) created over the surface of the first adhesion promotion layer 24

18, second copper plugs formed in the second layer 14 of dielectric; copper plugs 18 align with copper plugs 16, and, optionally

22, a second Etch Stop Layer (ESL) created over the surface of the second adhesion promotion layer 26

24, a first adhesion promotion layer created over the surface of the first layer 12 of dielectric

26, a second adhesion promotion layer created over the surface of the second layer 14 of dielectric.

In comparing the prior art method as reflected by the cross section of FIG. 1 with the invention as reflected by the cross section of FIG. 2, it is clear that the invention has added layers 24 and 26, that is an adhesion promotion interface between an overlying etch stop layer and underlying copper. Layer 24 and, optionally layer 26, can be created following one of four methods, as follows:

1. pre-heat the surface of the layer of copper, that is the surface of layer 16 (and optionally the surface of layer 18), followed by a Plasma Enhanced CVD treatment of surface of the layer of copper using ammonia ($NH_3$) as a source gas
2. pre-heat the surface of the layer of copper, that is the surface of layer 16 (and optionally the surface of layer 18), followed by a Plasma Enhanced CVD treatment of surface of the layer of copper using ammonia ($NH_3$)+ $N_2$ as source gasses
3. pre-heat the surface of the layer of copper, that is the surface of layer 16 (and optionally the surface of layer 18), followed by a Plasma Enhanced CVD treatment of surface of the layer of copper using ammonia ($NH_3$)+ alkyl-silane as source gasses, and
4. pre-heat the surface of the layer of copper, that is the surface of layer 16 (and optionally the surface of layer 18), followed by a Plasma Enhanced CVD treatment of surface of the layer of copper using ($NH_3$)+$N_2$ + alkyl-silane as source gasses.

Alkyl-silane is known to have a chemical composition of $CH_xR_{4-x}$ where x=1, 2 or 3 and R is methyl ($CH_3$) or ethyl ($C_2H_5$) or propyl ($C_3H_7$) etc., in accordance with the composition $C_nH_{2n+1}$.

Typical PECVD processes can be performed for the treatment of the surface of the layer of copper in a low pressure environment at a chamber pressure between about 0.3 Torr and 1.0 Torr, a temperature between about 300 and 450 degrees C. with a selection of the above indicated reactant gases at a flow rate between about 10 and 10,000 sccm in a diluent carrier gas $PH_3$ at a flow rate of between about 20 and 300 sccm, for a time of between about 3 seconds and 30 minutes.

The above indicated pre-heat the surface of the underlying layer of dielectric can be performed by applying a temperature between about 200 and 600 degrees C. at atmospheric pressure for a time between about 2 and 5 minutes.

The above indicated processing sequences uses as initial surface of the layer of copper a polished layer of copper, polished using methods of CMP. Pre-heating the surfaces of the layer of copper and the layer of dielectric removes any $H_2O$ from those surfaces in preparation of the PECVD treatment of the surface. The ammonia ($NH_3$) that is used as a source gas during the PECVD process moves copper oxide (CuO) from the surface of the layer 16 (optionally layer 18) of copper.

The grazing angle FTIR spectrum is a specially designed FTIR with a very high sensitivity. The spectrum shows, with significantly improved sensititity, the same information as is typically shown with a conventional FTIR, that is molecular vibration wavenumber, e.g. Cu—N vibration peak at 482 $cm^{-1}$ or Cu—O stretch at 652 $cm^{-1}$.

FIG. 3 further explains the molecular action that is created by the invention, as follows:

24 shows a cross section of a layer of copper on the surface of which the adhesion promotion layer of the invention is created, similar to layer 16 of FIG. 2

26 is the adhesion promotion layer of the invention, similar to layer 24 of FIG. 2; molecular interaction taking place over the surface of layer 24 is stimulated by the nitrogen (N) and hydrogen (H) rich environment that is created by the PECVD treatment of the invention; this PECVD treatment leads to creating copper-to-nitrogen (Cu—N) bonds as for example bonds 23 and 25. These Cu—N bonds improve the interface between the layer 24 of copper and the overlying layer 26 of adhesion promotion layer

28, a Etch Stop Layer (ESL) overlying the adhesion promotion layer, similar to layer 20 of FIG. 2

27 and 29, the silicon that is provided by the alki-silane of the PECVD process of the invention further creates bonds 27 and 29, enhancing adhesion between layer 26 of adhesion promotion layer and the overlying layer 28 of ESL. For many applications of a layer of ESL a material can be selected that comprises a silicon component, for instance dielectrics such as silicon dioxide ("oxide", doped or undoped) or silicon nitride ("nitride"), silicon oxynitride, silicon carbide (SiC), silicon oxycarbide (SiOC) and silicon nitro carbide (SiNC).

The indicated creation of molecular bonds such as bonds 23, 25, 27 and 29 assures that the surface treatment of the invention leads to meeting the objectives of the invention that is:

1. to provide a layer over the surface of a layer of copper that serves as an adhesion promotion layer and that has good adhesion to the surface of the layer of copper, and
2. to eliminate concerns of peeling or delamination between the surface of a layer of copper and an overlying layer of ESL.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to create a thin interface layer over the surface of a layer of copper that serves as an adhesion promotion layer and improves adhesion between a layer of copper and an overlying Etch Stop Layer (ESL), comprising the steps of:

providing a substrate, said substrate having been provided with at least one layer of copper over the surface thereof;

pre-heating the surface of said at least one layer of copper;

pre-cleaning the surface of said at least one layer of copper;

forming an adhesive enhanced layer over the surface of said at least one layer of copper; and depositing an etch stop layer over the surface of said adhesive enhanced layer.

2. The method of claim 1, said pre-heating comprising applying a temperature between about 200 and 600 degrees C. at atmospheric pressure for a time between about 2 and 5 minutes.

3. The method of claim 1, said pre-cleaning the surface of said at least one layer of copper is submitting the surface of said at least one layer of copper to a Plasma Enhance CVD treatment using $NH_3$ and $N_2$ as source gasses.

4. The method of claim 1, said forming an adhesive enhanced layer over the surface of said at least one layer of copper is exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a source gas.

5. The method of claim 4, said source gas being selected from the group consisting of $N_2$ and $O_2$ and $N_2$ with alkylsilane and alkylsilane.

6. The method of claim 4, said source gasses being applied at a flow rate between about 10 and 10,000 sccm, for a time of between about 3 seconds and 30 minutes.

7. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof;

pre-heating the surface of said at least one layer of copper by applying a temperature between about 200 and 600 degrees C. at atmospheric pressure for a time between about 2 and 5 minutes;

pre-cleaning the surface of said at least one layer of copper by submitting the surface of said at least one layer of copper to a Plasma Enhance CVD treatment using $NH_3$ and $N_2$ as first source gasses;

forming an adhesive enhanced layer over the surface of said at least one layer of copper by exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas; and depositing an etch stop layer over the surface of said adhesive enhanced layer.

8. The method of claim 7, said second source gas being selected from the group consisting of $N_2$ and $O_2$ and $N_2$ with alkylsilane and alkylsilane.

9. The method of claim 7, said second source gasses being applied at a flow rate between about 10 and 10,000 sccm, for a time of between about 3 seconds and 30 minutes.

10. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof; pre-heating the surface of said at least one layer of copper by applying a temperature between about 200 and 600 degrees C. at atmospheric pressure for a time between about 2 and 5 minutes;

pre-cleaning the surface of said at least one layer of copper by submitting the surface of said at least one layer of copper to a Plasma Enhance CVD treatment using $NH_3$ and $N_2$ as first source gasses;

forming an adhesive enhanced layer over the surface of said at least one layer of copper by exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas, said second source gas being selected from the group consisting of $N_2$ and $O_2$ and $N_2$ with alkylsilane and alkylsilane; and depositing an etch stop layer over the surface of said adhesive enhanced layer.

11. The method of claim 10, said second source gas being applied at a flow rate between about 10 and 10,000 sccm, for a time of between about 3 seconds and 30 minutes.

12. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof; pre-heating the surface of said at least one layer of copper by applying a temperature between about 200 and 600 degrees C. at atmospheric pressure for a time between about 2 and 5 minutes;

pre-cleaning the surface of said at least one layer of copper by submitting the surface of said at least one layer of copper to a Plasma Enhance CVD treatment using $NH_3$ and $N_2$ as first source gasses;

forming an adhesive enhanced layer over the surface of said at least one layer of copper by exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas, said second source gas being selected from the group consisting of $N_2$ and $O_2$ and $N_2$ with alkylsilane and alkylsilane, said source gasses being applied at a flow rate between about 10 and 10,000 sccm, for a time of between about 3 seconds and 30 minutes; and depositing an etch stop layer over the surface of said adhesive enhanced layer.

13. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof;

pre-heating the surface of said at least one layer of copper;

pre-cleaning the surface of said at least one layer of copper by applying a first process of PECVD to the surface of said at least one layer of copper;

forming an adhesive enhanced layer over the surface of said at least one layer of copper by applying a second process of PECVD to the surface of said at least one layer of copper; and depositing an etch stop layer over the surface of said adhesive enhanced layer.

14. The method of claim 13, said pre-heating comprising applying a temperature between about 200 and 600 degrees C. at atmospheric pressure for a time between about 2 and 5 minutes.

15. The method of claim 13, said first process of PECVD is applying a Plasma Enhance CVD to the surface of said at least one layer of copper using $NH_3$ and $N_2$ as first source gasses.

16. The method of claim 13, said second process of PECVD to the surface of said at least one layer of copper is exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas.

17. The method of claim 16, said second source gas being selected from the group consisting of $N_2$ and $O_2$ and $N_2$ with alkylsilane and alkylsilane.

18. The method of claim 16, said second source gasses being applied at a flow rate between about 10 and 10,000 sccm, for a time of between about 3 seconds and 30 minutes.

19. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof;

pre-heating the surface of said at least one layer of copper by applying a temperature between about 200 and 600 degrees C. at atmospheric pressure for a time between about 2 and 5 minutes;

pre-cleaning the surface of said at least one layer of copper by applying a first process of PECVD to the surface of said at least one layer of copper;

forming an adhesive enhanced layer over the surface of said at least one layer of copper by applying a second process of PECVD to the surface of said at least one layer of copper; and depositing an etch stop layer over the surface of said adhesive enhanced layer.

20. The method of claim 19, said first process of PECVD is applying a Plasma Enhance CVD to the surface of said at least one layer of copper using $NH_3$ and $N_2$ as first source gasses.

21. The method of claim 19, said second process of PECVD to the surface of said at least one layer of copper is exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas.

22. The method of claim 21, said second source gas being selected from the group consisting of $N_2$ and $O_2$ and $N_2$ with alkylsilane and alkylsilane.

23. The method of claim 21, said second source gasses being applied at a flow rate between about 10 and 10,000 sccm, for a time of between about 3 seconds and 30 minutes.

24. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof;

pre-heating the surface of said at least one layer of copper by applying a temperature between about 200 and 600 degrees C. at atmospheric pressure for a time between about 2 and 5 minutes;

pre-cleaning the surface of said at least one layer of copper by applying a first process of PECVD to the surface of said at least one layer of using $NH_3$ and $N_2$ as first source gasses;

forming an adhesive enhanced layer over the surface of said at least one layer of copper by applying a second process of PECVD to the surface of said at least one layer of copper; and depositing an etch stop layer over the surface of said adhesive enhanced layer.

25. The method of claim 24, said second process of PECVD to the surface of said at least one layer of copper is exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C. exposing the surface of said at least one layer of cooper to a second source gas.

26. The method of claim 25, said second source gas being selected from the group consisting of $N_2$ and $O_2$ and $N_2$ with alkylsilane and alkylsilane.

27. The method of claim 25, said source gasses being applied at a flow rate between about 10 and 10,000 sccm, for a time of between about 3 seconds and 30 minutes.

28. A method to create a thin interface layer over the surface of a layer of copper that serves as an adhesion promotion layer and improves adhesion between a layer of copper and an overlying layer of ESL, comprising the steps of:

providing a substrate, said substrate having been provided with at least one layer of copper over the surface thereof;

pre-heating the surface of said at least one layer of copper by applying a temperature between about 200 and 600 degrees C. at atmospheric pressure for a time between about 2 and 5 minutes;

pre-cleaning the surface of said at least one layer of copper by applying a first process of PECVD to the surface of said at least one layer of using $NH_3$ and $N_2$ as first source gasses;

forming an adhesive enhanced layer over the surface of said at least one layer of copper by applying a second process of PECVD to the surface of said at least one layer of copper using a second source gas that is selected from the group consisting of $N_2$ and $O_2$ and $N_2$ with alkylsilane and alkylsilane; and depositing an etch stop layer over the surface of said adhesive enhanced layer.

29. The method of claim 28, said second process of PECVD to the surface of said at least one layer of copper is exposing the surface of said at least one layer of copper to a Plasma Enhanced CVD (PECVD) treatment in a low pressure environment at a chamber pressure between about 0.3 Torr and 1.0 Torr, a temperature between about 300 and 450 degrees C.

30. The method of claim 28, said second source gas being applied at a flow rate between about 10 and 10,000 sccm, for a time of between about 3 seconds and 30 minutes.

* * * * *

UNITED STATES PATENT AND TRADEMARK OFFICE
CERTIFICATE OF CORRECTION

PATENT NO.     : 6,623,654 B2
DATED          : September 23, 2003
INVENTOR(S)    : Bi-Trong Chen et al.

It is certified that error appears in the above-identified patent and that said Letters Patent is hereby corrected as shown below:

<u>Title page,</u>
Item [75], delete "Bi-Trong Chen, Taiwan (TW)", and replace with
-- Bi-Trong Chen, Kuenming Village (TW) -- and delete "Shu E. Ku, Miadi (TW)",
and replace with -- Shu E. Ku, Miaoli (TW) --.

Signed and Sealed this

Twenty-third Day of December, 2003

JAMES E. ROGAN
*Director of the United States Patent and Trademark Office*